United States Patent [19]
Dixit et al.

[11] Patent Number: 5,440,166
[45] Date of Patent: Aug. 8, 1995

[54] PLANARIZED ISOLATION STRUCTURE FOR CMOS DEVICES

[75] Inventors: Girish A. Dixit; Fusen E. Chen, both of Dallas; Robert O. Miller, The Colony, all of Tex.

[73] Assignee: SGS-Thomson Microelectronics, Inc., Carrollton, Tex.

[21] Appl. No.: 276,039

[22] Filed: Jul. 15, 1994

Related U.S. Application Data

[60] Continuation of Ser. No. 52,886, Apr. 26, 1993, abandoned, which is a division of Ser. No. 785,774, Oct. 31, 1991, Pat. No. 5,244,827.

[51] Int. Cl.⁶ .......................................... H01L 21/473
[52] U.S. Cl. ................................. 257/506; 257/510; 257/634
[58] Field of Search ............... 257/508, 513, 520, 524, 257/506, 510, 509, 374, 634, 644

[56] References Cited

U.S. PATENT DOCUMENTS

| | | | |
|---|---|---|---|
| 3,984,859 | 10/1976 | Misawa et al. | 257/510 |
| 4,396,460 | 8/1983 | Tamaki et al. | 257/520 |
| 4,571,819 | 2/1986 | Rogers et al. | 257/520 |
| 5,045,904 | 9/1991 | Kobayashi et al. | 257/513 |
| 5,128,743 | 7/1992 | Tamaki et al. | 257/513 |
| 5,221,857 | 6/1993 | Kano | 257/510 |

FOREIGN PATENT DOCUMENTS

| | | | |
|---|---|---|---|
| 0147626 | 7/1985 | European Pat. Off. | 257/506 |
| 0101289 | 8/1979 | Japan | 257/506 |
| 0140137 | 8/1983 | Japan | 257/520 |
| 0040741 | 2/1987 | Japan | 257/513 |
| 0062061 | 3/1990 | Japan | 257/520 |
| 0229443 | 10/1991 | Japan | 257/510 |

OTHER PUBLICATIONS

S. M. Sze, Semiconductor Devices/Phys. & Tech., Part of Chapter 9, Oxidation & Film Dep. pp. 341–363, 1985.

*Primary Examiner*—William Mintel
*Assistant Examiner*—Peter Toby Brown
*Attorney, Agent, or Firm*—Kenneth C. Hill; Lisa K. Jorgenson; Richard K. Robinson

[57] ABSTRACT

A field oxide structure is formed within a cavity formed in a semiconductor substrate. The cavity has a U-shaped cross section. A layer of thermal oxide covers the walls and bottom of the cavity, and a region of reflowable glass or spin on glass fills the cavity. A layer of undoped oxide, having an upper surface coplanar with the substrate upper surface is formed over the cavity, so that the spin on or reflowable glass is completely surrounded by either thermal oxide or an undoped oxide layer.

6 Claims, 2 Drawing Sheets

PLANARIZED ISOLATION STRUCTURE FOR CMOS DEVICES

This application is a continuation of Ser. No. 08/052,886, filed Apr. 26, 1993 and now abandoned, which is a division of Ser. No. 07/785,774, filed Oct. 31, 1991 and now U.S. Pat. No. 5,244,827.

BACKGROUND OF THE INVENTION

1. Field of the Invention

The present invention relates generally to semiconductor integrated circuits, and more specifically to the formation of field oxide regions in a semiconductor substrate.

2. Description of the Prior Art

The increase in densities of integrated circuits has raised issues of how to miniaturize components within an integrated circuit, while maintaining the reliability and proper operation of the device. When building a variety of components on one integrated circuit, it is necessary to isolate active areas in the substrate. A common method for isolating active areas is through the formation of field oxide regions. In this process regions of silicon dioxide are selectively formed on the substrate. This is typically known in the art as local oxidation of silicon, or LOCOS.

Several problems are encountered however, with the conventional process of forming field oxide regions. First, LOCOS produces a bird's beak caused by lateral diffusion of the silicon dioxide. This lateral diffusion has the undesirable effect of reducing the size of the active areas within the substrate.

Another problem is a condition known as latchup. Latchup is caused by parasitic devices which are inherent components of any CMOS device. These parasitic components are formed by the various physical regions which make up the CMOS device.

Those skilled in the art will recognize that one technique used to lower the probability of latchup is the formation of a channel stop region. Another possible solution is to form a field oxide region which extends deeper into the substrate. This has the effect of increasing the threshold voltages of the parasitic components. However, when forming a field oxide region that extends deeper into the substrate, the resulting structure becomes more non-planar. This undesirable effect makes further processing steps more difficult.

Therefore, it would be desirable to provide a technique for forming field oxide regions that are more planar with the substrate and extend deeper into the substrate, and that when formed have little or no bird's beak.

SUMMARY OF THE INVENTION

It is therefore an object of the present invention to provide a method for forming field oxide regions which extend deeply into the semiconductor substrate.

It is another object of the present invention to provide a method for forming field oxide regions which are more planar with the upper surface of the semiconductor substrate.

It is another object of the present invention to provide such a method and structure which is compatible with standard process flows, and which adds minimal additional complexity to the fabrication of a typical integrated circuit.

Therefore, according to the present invention, a field oxide structure is formed within a cavity formed in a semiconductor substrate. The cavity has a U-shaped cross section. A layer of thermal oxide covers the walls and bottom of the cavity, and a region of reflowable glass or spin on glass fills the cavity. A layer of undoped oxide, having an upper surface coplanar with the substrate upper surface is formed over the cavity, so that the spin on or reflowable glass is completely surrounded by either thermal oxide or an undoped oxide layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
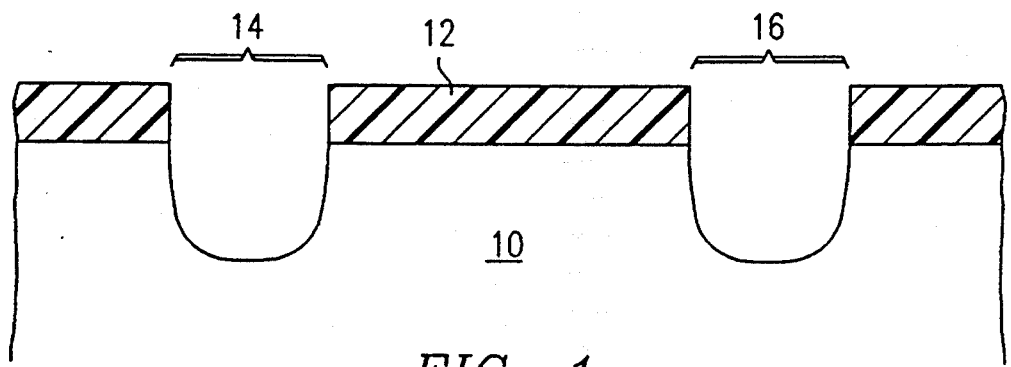
FIGS. 1-8 illustrate a preferred method of forming field oxide regions for integrated circuits according to the present invention.

Referring to FIG. 1, an integrated circuit will be formed in and on a substrate 10. A masking layer 12 is deposited and patterned on the surface of the substrate 10. Cavities 14, 16 are then formed by etching into the substrate 10. The preferred method for creating cavities 14, 16 is to perform an anisotropic etch on the exposed areas of the substrate 10. However, the cavities 14, 16 can also be formed by isotropically etching the substrate 10.

Figure 2:
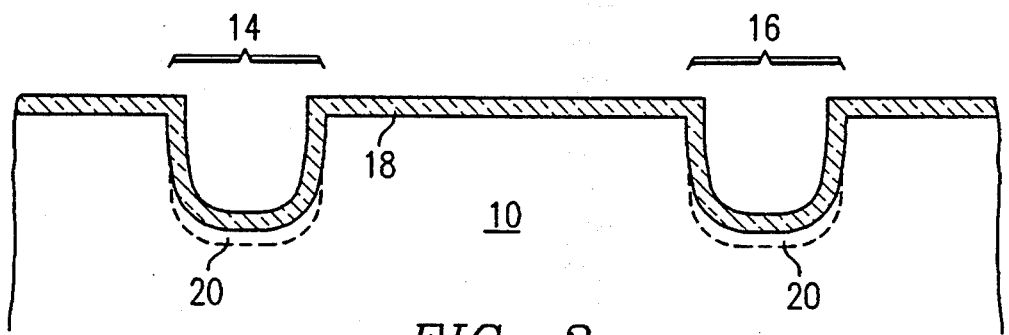

FIG. 2 illustrates the integrated circuit after the masking layer 12 is removed, and a layer of oxide 18 is grown over the device. Those skilled in the art will recognize that a channel stop implant or diffusion 20 can be formed before the layer of oxide 18 is grown over the device. The purpose of the channel stop 20 is to prevent latchup, which is caused by turning on the parasitic components within the device.

Figure 3:
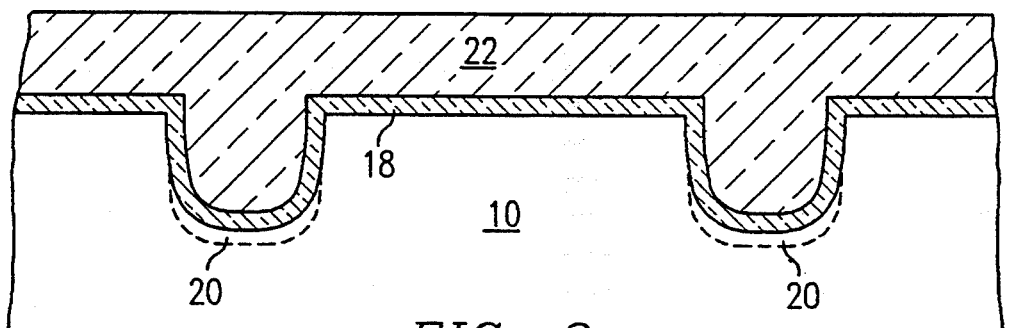

Referring to FIG. 3, a layer of planarizing material 22 is deposited over the device. The planarizing layer can be formed from any material which can be planarized and has physical properties consistent with its use as described below. For example, reflowable or spin on glass can be used as planarizing material. An anisotropic etch is then performed over the device to expose the active areas within the substrate. The etchants should be matched with the planarizing material so that the oxide 18 and planarizing material 22 etch at approximately the same rate. If the upper surface of layer 22 is actually substantially planar, as shown, an isotropic etchback could also be performed if desired.

Figure 4:
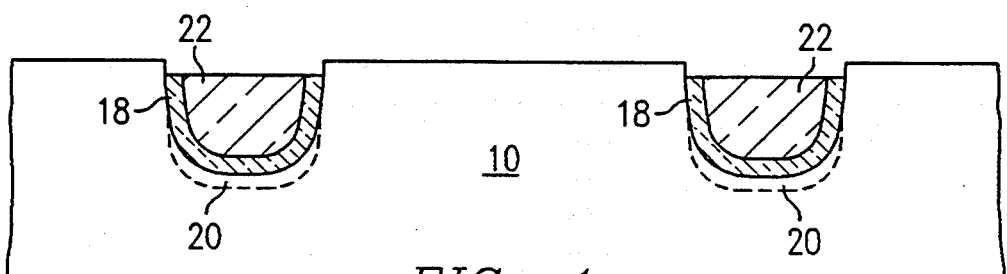

FIG. 4 illustrates the device after the planarizing 22 and oxide 18 layers are etched back. As can be seen, the planarizing material 22 is removed so as to expose a portion of the cavities.

Figure 5:
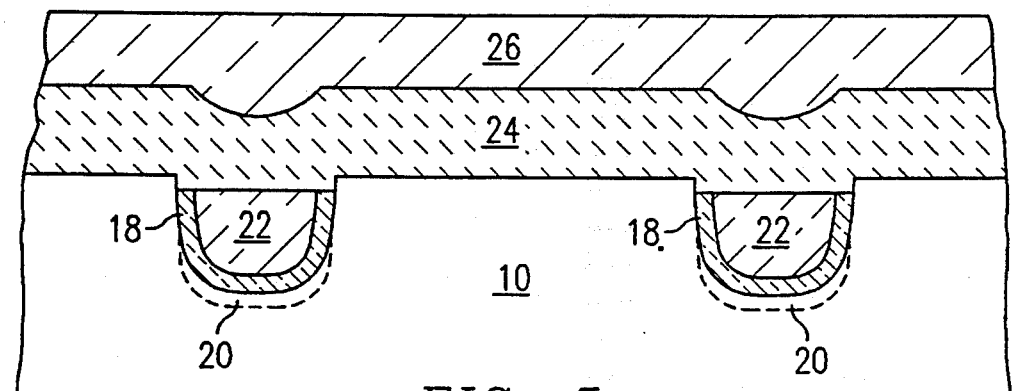

Referring to FIG. 5, a conformal layer 24 is then deposited over the device, followed by a second layer of planarizing material 26. The conformal layer 24 can be made of undoped oxide or polycrystalline silicon converted to oxide. The second layer 26 can consist of reflowable or spin on glass. The selection of materials, however, for the first conformal layer 24 and the second layer of planarizing material 26 is not critical, so long as the upper surface of the second layer 26 is planar, and the second layer 26 and the first conformal layer 24 can be etched at the same rate using a single etch chemistry. An anisotropic etch is then performed over the device to expose the active areas within the substrate.

Figure 6:
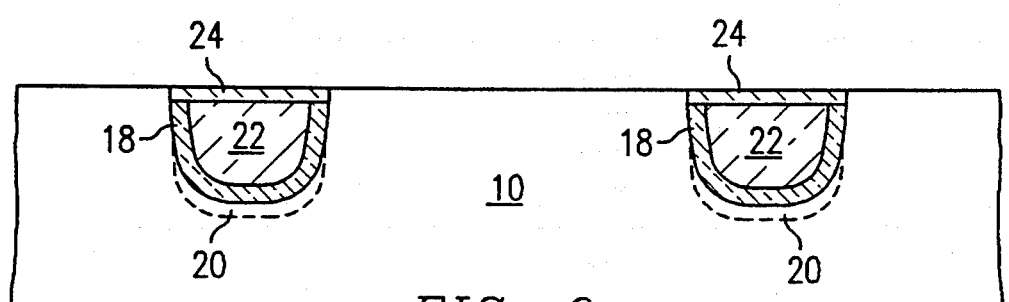

FIG. 6 illustrates the device after formation of the field oxide regions is complete. The integrated circuit is now ready for further processing using techniques which are known in the art.

Figure 7:
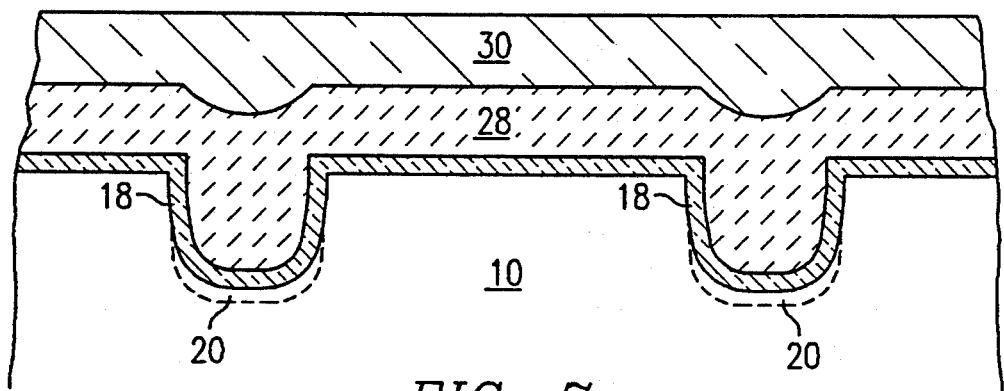
Figure 8:
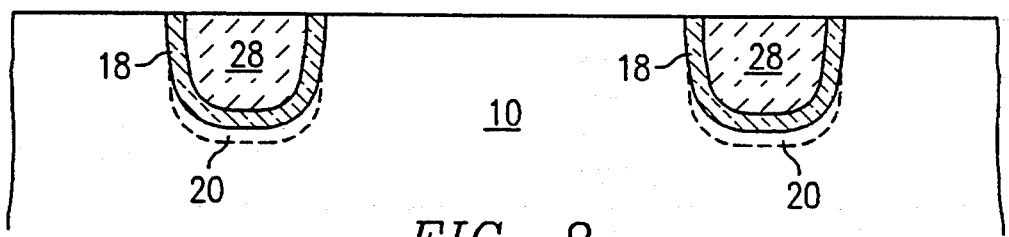

An alternative to the above described process is illustrated in FIG. 7. First conformal layer 28 is deposited over the device, followed by a layer of planarizing material 30. The first conformal layer 28 can be a layer of polycrystalline silicon converted to oxide or an undoped deposited oxide. The second layer of planarizing material 30 can consist of reflowable or spin on glass. The selection of materials, however, for the conformal layer 28 and the second layer 30 is not critical, so long as the upper surface of the second layer 30 is planar, and the second layer 30, the first conformal layer 28, and the oxide layer 18 can be etched at the same rate using a single etch chemistry. FIG. 8 illustrates the device after formation of the oxide regions is complete. The integrated circuit is now ready for further processing using techniques which are known in the art.

As an example of the preferred embodiment, the following dimensions are used to illustrate the process flow. The cavities 14, 16 within the substrate 10 can be formed to a depth between approximately 2000 to 8000 angstroms. The layer of oxide 18 can be grown to be 1000-3000 angstroms thick. The first planarizing layer 22 can reach a thickness of 3000 angstroms or more. The conformal layer 24 can be approximately 1000 angstroms thick. Finally, the second layer of planarizing material 26 can be approximately 1000 angstroms thick.

As will be appreciated by those skilled in the art, the technique described above creates field oxide regions which are planar with the upper surface of the semiconductor substrate and contain little or no bird's beak. This maximizes the ratio of useful active area to total chip area, and eliminates field oxide step coverage problems. Additionally, the field oxide extends deeper or further into the substrate. This provides the added advantage of increasing field threshold voltages of the parasitic components within the integrated circuit.

While the invention has been particularly shown and described with reference to a preferred embodiment, it will be understood by those skilled in the art that various changes in form and detail may be made therein without departing from the spirit and scope of the invention.

What is claimed is:

1. An isolation structure for an integrated circuit device, comprising:

a substrate having a substantially planar upper surface;

a cavity formed in the substrate, extending from the upper surface into the substrate, wherein the cavity has a U-shaped cross section, with a bottom portion substantially parallel to the substrate upper surface, and with sidewalls perpendicular to the substrate upper surface;

a first layer of oxide covering lower portions of the sidewalls and the bottom portion of the cavity leaving a thin upper portion of the sidewalls uncovered by the first layer of oxide, wherein the first layer has the physical characteristics of thermally grown oxide;

a second layer of oxide contacting the first layer of oxide and covering the cavity to define, along with the first oxide layer, an internal region within the cavity, wherein the second layer of oxide contacts the substrate sidewalls in the thin upper portion uncovered by the first layer of oxide and has an upper surface coplanar with the substrate upper surface, and further wherein the second layer of oxide has the physical characteristics of an undoped oxide; and a region of glass completely filling the internal region within the cavity, wherein the region of glass has the physical characteristics of a reflowable glass.

2. The isolation structure of claim 1, wherein the first oxide layer has a thickness of between 1000 Å and 3000 Å.

3. The isolation structure of claim 1, further comprising a channel stop region within the substrate and immediately below the cavity.

4. An isolation structure for an integrated circuit device, comprising:

a substrate having a substantially planar upper surface;

a cavity formed in the substrate, extending from the upper surface into the substrate, wherein the cavity has a U-shaped cross section, with a bottom portion substantially parallel to the substrate upper surface, and with sidewalls perpendicular to the substrate upper surface;

a first layer of oxide covering lower portions of the sidewalls and the bottom portion of the cavity leaving a thin upper portion of the sidewalls uncovered by the first layer of oxide, wherein the first layer has the physical characteristics of thermally grown oxide;

a second layer of oxide contacting the first layer of oxide and covering the cavity to define, along with the first oxide layer, an internal region within the cavity, wherein the second layer of oxide contacts the substrate sidewalls in the thin upper portion uncovered by the first layer of oxide and has an upper surface coplanar with the substrate upper surface, and further wherein the second layer of oxide has the physical characteristics of an undoped oxide; and a region of glass completely filling the internal region within the cavity, wherein the region of glass has the physical characteristics of a spin on glass.

5. The isolation structure of claim 4, wherein the first oxide layer has a thickness of between 1000 Å and 3000 Å.

6. The isolation structure of claim 4, further comprising a channel stop region within the substrate and immediately below the cavity.

* * * * *